US00H002128H

(19) United States

(12) Statutory Invention Registration

Devine et al.

(10) Reg. No.: US H2128 H

(43) Published: Oct. 4, 2005

(54) RADIATION HARDENED MICROCIRCUITS

(75) Inventors: Roderick Anthony Blunden Devine, Albuquerque, NM (US); Joseph R. Chavez, Los Lunas, NM (US)

(73) Assignee: The United States of America as represented by the Secretary of the Air Force, Washington, DC (US)

(21) Appl. No.: 09/681,894

(22) Filed: Jun. 21, 2001

(65) Prior Publication Data

US 2003/0022527 A1 Jan. 30, 2003

(51) Int. Cl.[7] ..... H01L 21/31

(52) U.S. Cl. ..... 438/795

(58) Field of Search ..... 438/795, 798, 438/592, 530, 289, 287, 257, 71, 81, 413, 430, 301, 333, 404, 189

(56) References Cited

U.S. PATENT DOCUMENTS 5,872,387 A * 2/1999 Lyding et al. ..... 257/607
6,159,829 A * 12/2000 Warren et al.
6,328,801 B1 * 12/2001 Gary et al. ..... 118/688

OTHER PUBLICATIONS

I.C. Kizilyalli et al., "Deuterium Post–Metal Annealing of MOSFET's for Improved Hot Carrier Reliability", IEEE Electron Device Letters, vol. 18, No. 3, Mar. 1997, pp. 81–83.*

* cited by examiner

*Primary Examiner*—Michael J. Carone

*Assistant Examiner*—M. Thomson

(74) *Attorney, Agent, or Firm*—James M. Skorich; Kenneth E. Callahan

(57) ABSTRACT

A method of radiation hardening microcircuits including the steps of removing hydrogen from the microcircuit in a vacuum furnace and annealing in deuterium-containing forming gas.

12 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

RADIATION HARDENED MICROCIRCUITS

FEDERAL RESEARCH STATEMENT

[The condition under which this invention was made are such as to entitle the Government of the United States under paragraph I(a) of Executive Order 10096, as represented by the Secretary of the Air Force, to the entire right, title and interest therein including foreign rights.]

BACKGROUND OF INVENTION

The present invention is in the field of semiconductor device fabrication, and in particular, relates to the radiation hardening of microcircuits.

In standard microelectronics technology one of the finally processes undergone is an anneal of the finished circuit in forming gas (a mixture of hydrogen and nitrogen or argon) at temperatures in the range 380° C. to 430° C. for periods of up to 30 minutes. Rapid thermal annealing has also been used. The primary objective of these anneals is to passivate the interface (dielectric/semiconductor) of the metal-oxide-semiconductor field effect transistors (MOSFETs) in order to enhance the carrier mobility in the inversion channel of the transistor and to eliminate threshold voltage shifts due to the presence of interface states. The subsequent depassivation of the interface (involving removal or release of the bonded hydrogen atoms attached during the passivation anneal) by hot carrier injection from the inversion channel during normal operation is the process by which degradation and aging of the device occurs. Failure of the device is usually observed when the hot electron induced degradation results in device channel mobility or threshold voltage shift outside a range of values considered acceptable.

It is known that if the gas used during the passivation anneal is one in which the hydrogen component is replaced by deuterium, then the resistance of the transistor dielectric/semiconductor interface to hot electron degradation is substantially increased. This resistance to hot electron degradation is specifically related to replacement of silicon-hydrogen bonds at the interface by silicon-deuterium bonds.

U.S. Pat. No. 6,143,632 addresses the problem of hot carrier degradation at the interface between the silicon substrate and the $SiO_2$ gate oxide layer by introducing deuterium before the uppermost conductive layer is formed, i.e., the gate oxide is grown in a $D_2O$ vapor atmosphere which then diffuses through the gate oxide to the $Si/SiO_2$ interface. The final annealing step is performed in a deuterium atmosphere at about 400 to 550° C. for 30 minutes.

Other research has addressed the issue of electrical stress induced leakage currents (SILC) through the gate dielectric itself of the MOSFET. In this case, electrical charge is injected into the gate dielectric by application of a large electric field between the gate electrode and the substrate/source/drain contacts of the device. The mechanism invoked is the so-called Fowler-Nordheim tunneling. This becomes significant only when the electric field exceeds values of about 4 MV $cm^{-1}$. Device operating voltages are usually such that this regime of operation is avoided. In this case, it has been demonstrated that annealing of the finished devices in deuterium containing gas can result in an improved resistance to SILC. If the dielectric itself ($SiO_2$) is grown in a wet atmosphere ($D_2O+O_2$) then additional improvements in resistance to SILC can be obtained.

There is an important difference between radiation hardening a circuit and hardening a particular device within a circuit to improve resistance to hot carrier degradation or SILC. A circuit is comprised of three important areas where there are dielectrics that can be a source of radiation sensitivity. These areas are: (a) the gate oxide of the device (elemental transistor); (b) the field or isolation oxide (isolating one device from its neighbor); and (c) the isolation layer between interconnect lines (usually metallic) which link device to device or device to the outside world. For most purposes it is the field or isolation oxide (b) which is the most important in radiation hardness. The gate oxide (a) is most important in device reliability and lifetime. The isolation layer between interconnect lines (c) may be important for overall circuit failure, but its importance for radiation hardness is unknown.

Current annealing techniques are directed toward reducing the hot carrier degradation and the SILC problems of specific semiconductor devices. They are not directed toward increasing the resistance of the overall circuit to damage caused by external radiation. Accordingly, there is a need for an annealing technique that can accomplish this and in particular that can improve the radiation hardness of the field or isolation oxides used throughout semiconductor circuits.

SUMMARY OF INVENTION

According to one aspect of the present invention, a silicon-based semiconductor microcircuit is radiation hardened by replacing the standard finished circuit anneal process by heating the microcircuit in a vacuum furnace to remove any hydrogen in the microcircuit structure and annealing the microcircuit with deuterium containing forming gas. This process significantly increases the radiation hardness of the circuit while at the same time reducing hot carrier degradation and electrical stress induced leakage currents of individual circuit components.

Other aspects and advantages of the present invention will become apparent from the following detailed description, taken in conjunction with the accompanying drawing, illustrating by way of example the principles of the invention.

DETAILED DESCRIPTION

Figure 1:
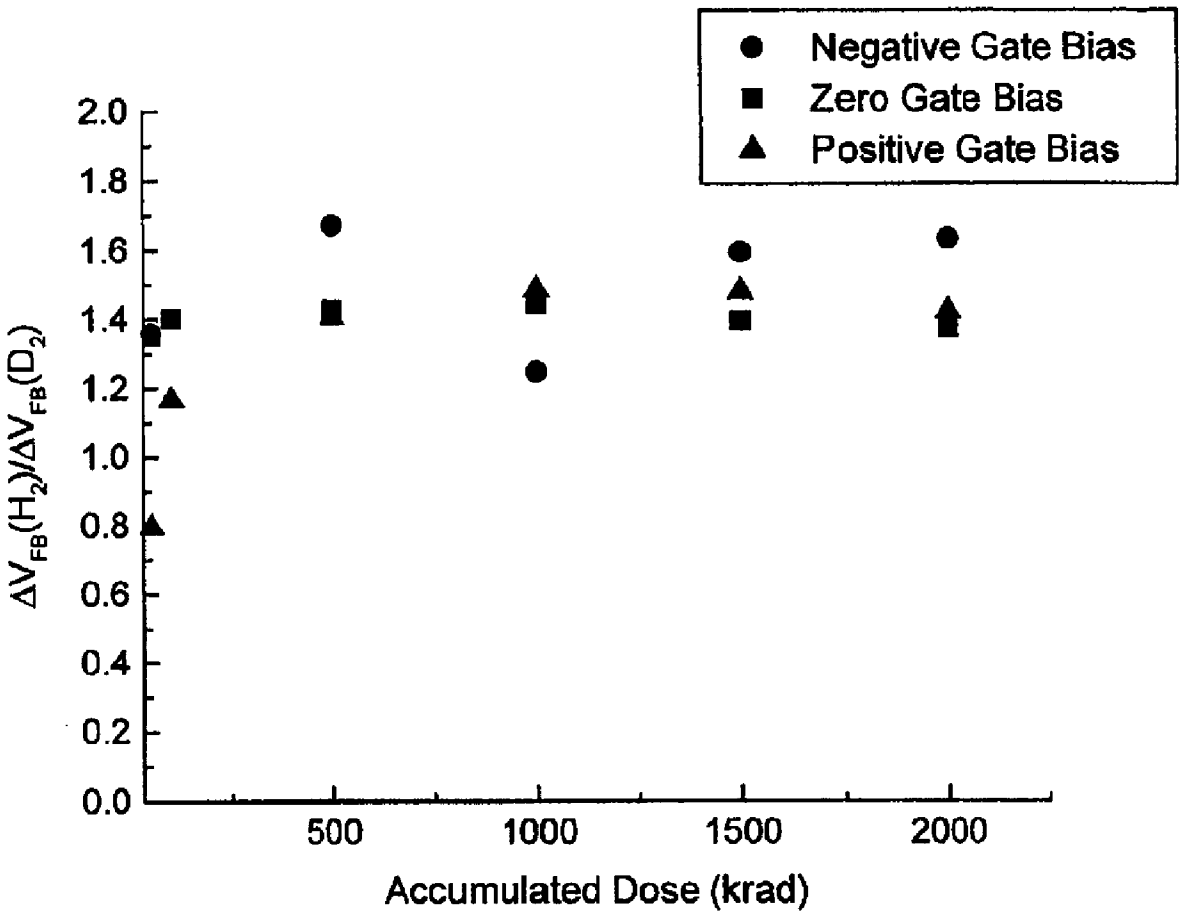
FIG. 1 is a plot of the ratio of the flat band voltage shifts in hydrogen and deuterium annealed capacitor structures as a function of X-ray dose for various electrical fields applied during the irradiation process.

Typical silicon-based semiconductor circuits are made up of various devices, e.g., transistors, interconnect lines between the various devices, and isolating dielectrics separating the devices and interconnects from each other. Of these components, the isolating dielectrics are the most susceptible to damage from external radiation. The annealing process of the present invention significantly improves the radiation hardness of these circuits while at the same time reducing hot carrier degradation and electrical stress-induced leakage currents in the individual devices of which the circuit is partly comprised.

One aspect of the invention is the unique post-fabrication annealing process applied to the semiconductor circuit. First, the finished circuit is baked in a vacuum ($<10^{-6}$ torr) for approximate one hour at about 500° C. to remove any hydrogen in the circuit resulting from the fabrication process. The temperature of this out-gassing anneal stage is chosen to enhance removal of any hydrogen preexisting in the circuit from earlier process steps. Generally the temperature will be in the range of 400 to 700° C. The furnace temperature is then reduced and the circuit allowed to stabilize. After stabilization, the furnace is backfilled with deuterium-containing forming gas and annealed. This passivating anneal is carried out in a forming gas atmosphere in which the usual hydrogen component is replaced by deuterium. The temperature and duration of the passivating anneal is comparable to that customarily used in the passivating anneal process, e.g., 30 minutes at 420° C. This annealing process significantly improves the radiation hardness of the circuit.

A microcircuit can also be radiation hardened to an extent by skipping the out-gassing step and using deuterium-containing forming gas rather than hydrogen in the otherwise standard final passivating anneal. As a further refinement, radiation hardening of a microcircuit is improved by substituting deuterium at each step in the microcircuit fabrication process whenever hydrogen gas or hydrogen containing species are otherwise used.

An experiment to determine the effectiveness of the radiation hardening process was performed that measured the amount of radiation-induced charge in the isolating oxide of a semiconductor circuit. Standard 20-nm thick $SiO_2$ films were grown on p-type silicon wafers in a dry oxygen atmosphere. A 200-nm thick polycrystalline silicon film was deposited on the oxide. It was implanted with P ions ($3\times10^{15}$ $cm^{-2}$ at an energy of 40 keV) and subsequently annealed for 3 minutes at 1000° C. in order to redistribute the dopant species in the polycrystalline layer and electrically activate them. MOS capacitor pads were etched in the 200 nm film (areas 0.00093 0.0028 $cm^{-2}$) using a lithographic process and dry etching ($XeF_2$ gas). The finished capacitor structures were then annealed for about 1 hour at 520° C. in vacuum ($<10^{-6}$ torr) to remove any hydrogen in the structure (introduced, for example during the polysilicon deposition process). The furnace temperature was then reduced to 420° C. After stabilization the furnace tube was backfilled with either deuterium-containing forming gas or hydrogen-containing forming gas. The anneal time was 30 minutes.

Capacitance/voltage measurements were obtained using the capacitor structures post-irradiation from an ARACOR X-ray source (tungsten electrode). The irradiations were carried out either with the top electrode and silicon substrate shorted electrically or with and electric field of ±0.5 MV $cm^{-1}$ applied across the oxide. Post-irradiation the capacitance/voltage characteristics were again measured and the evolution of the flat band voltage and the density of interface states measured. A series of measurements of the flat band voltage shift were obtained as a function of electric field applied during irradiation and of the irradiation dose.

The flat band voltage shift ($\Delta V_{FB}$) is directly related to the amount of radiation induced charge in the oxide. The flat band voltage shifts were characterized from the un-irradiated capacitor values as $\Delta V_{FB}(D_2)$ and $\Delta V_{FB}(H_2)$ for the cases of deuterium annealed oxide and hydrogen annealed oxide. The ratio $\Delta V_{FB}(H_2)/\Delta V_{FB}(D_2)$ was calculated and plotted it in FIG. 1. Since the ratio of flat band voltage shifts is greater than unity one can conclude that the radiation sensitivity is significantly reduced in the oxides annealed in deuterium containing gas as compared to those annealed in the hydrogen containing gas. The hydrogen-annealed capacitors were found to be approximately 50% more sensitive, independent of the electric field applied during the irradiation process.

What is claimed is:

1. A silicon-based semiconductor microcircuit radiation hardening method comprised of:

heating the microcircuit in a vacuum furnace to remove any hydrogen in the microcircuit structure; and annealing the microcircuit with deuterium containing forming gas.

2. The radiation hardening method of claim 1, wherein the microcircuit is heated in a vacuum for approximately 1 hour at between 400 and 700° C.

3. The radiation hardening method of claim 2, wherein the microcircuit is heated in a vacuum of $10^{-6}$ torr or less.

4. The radiation hardening method of claim 3, wherein the microcircuit is annealed in deuterium-containing forming gas for about 30 minutes at about 400° C.

5. The radiation hardening method of claim 3, wherein the microcircuit includes MOSFET devices.

6. The radiation hardening method of claim 3, wherein the microcircuit includes EEPROM devices.

7. A radiation hardened silicon-based semiconductor microcircuit prepared by a process comprising the steps of:

fabricating the microcircuit using standard techniques of silicon-based microelectronics up to the step of passivation using a forming gas anneal;

heating the microcircuit in a vacuum furnace to remove any hydrogen in the microcircuit structure; and annealing the microcircuit with deuterium containing forming gas.

8. The radiation hardened semiconductor microcircuit of claim 7, wherein during the heating step, the microcircuit is heated in a vacuum for approximately 1 hour at about 500° C.

9. The radiation hardened semiconductor microcircuit of claim 8, wherein during the heating step, the microcircuit is heated in a vacuum of $10^{-6}$ torr or less.

10. The radiation hardened semiconductor microcircuit of claim 9, wherein the microcircuit is annealed in deuterium-containing forming gas for about 30 minutes at about 400° C.

11. A radiation hardened silicon-based semiconductor microcircuit prepared by a process comprising the steps of:

fabricating the microcircuit using standard techniques of silicon-based microelectronics up to the step of heating the microcircuit;

heating the microcircuit in a vacuum; and annealing the microcircuit with deuterium-containing forming gas.

12. A radiation hardened silicon-based semiconductor microcircuit prepared by a process comprised of:

fabricating the microcircuit using standard techniques of silicon-based microelectronics except that deuterium is substituted for hydrogen in any fabrication step that involves hydrogen gas or hydrogen-containing species, and heating the microcircuit in a vacuum.

* * * * *